United States Patent [19]

Henderson

[11] Patent Number: 4,612,670

[45] Date of Patent: Sep. 16, 1986

[54] ELECTRO-OPTICAL CONNECTION BETWEEN ELECTRONIC MODULES

[75] Inventor: J. Kirston Henderson, Fort Worth, Tex.

[73] Assignee: General Dynamics Corporation, Fort Worth, Tex.

[21] Appl. No.: 610,764

[22] Filed: May 16, 1984

[51] Int. Cl.[4] ............................................. H04B 9/00
[52] U.S. Cl. ..................... 455/607; 250/551; 455/602
[58] Field of Search ............ 455/602, 606, 607, 612, 455/617; 350/96.15, 96.16; 250/551; 361/392, 393, 394, 395, 396

[56] References Cited

U.S. PATENT DOCUMENTS

| | | | |
|---|---|---|---|
| 3,566,127 | 2/1971 | Hafner | 455/606 |
| 3,777,154 | 12/1973 | Lindsey | 250/551 |
| 3,792,208 | 2/1974 | Meyer | 250/551 |
| 4,234,968 | 11/1980 | Singh | 455/607 |
| 4,321,707 | 3/1982 | Beasley et al. | 455/606 |
| 4,358,858 | 11/1982 | Tamura et al. | 455/607 |
| 4,491,942 | 1/1985 | Witte et al. | 455/612 |
| 4,491,981 | 1/1985 | Weller et al. | 455/602 |
| 4,491,984 | 1/1985 | Wiedmer | 455/606 |
| 4,499,608 | 2/1985 | Broockman et al. | 455/617 |

OTHER PUBLICATIONS

Korth—"Optical Multichannel Connection"—IBM Tech. Discl. Bulletin, vol. 18, #7, Dec. 1975, p. 2187.

*Primary Examiner*—Joseph A. Orsino, Jr.
*Attorney, Agent, or Firm*—James E. Bradley

[57] ABSTRACT

Electro-optical interface connections between electronic modules are used for data transmission rather than conventional pin and socket connections. Each module has on its top a number of diode pairs, one of the diodes transmitting light, and the other receiving light, and converting the light into electrical pulses. A data bus block is mounted across the tops of the modules. The data bus block has corresponding diode pairs that align with the diode pairs in the modules. Light pulses may be transmitted from the modules to the data bus block onto parallel data bus lines, then transmitted back to other modules from the data bus lines. On another side of the module, a serial electro-optical connection using a diode pair transmits to and receives light pulses from a fiber optic line for communicating with modules other than in the cluster.

5 Claims, 9 Drawing Figures

ELECTRO-OPTICAL CONNECTION BETWEEN ELECTRONIC MODULES

BACKGROUND OF THE INVENTION

1. Field of the Invention

This invention relates in general to communication of data between electronic modules, and in particular to an electro-optical means for communicating data between modules.

2. Description of the Prior Art

Conventional electronic processing equipment, such as used in aircraft control systems, uses numerous circuit boards or modules containing electronic circuitry. Each circuit board or card has a large number of mechanical connections at its base or bottom for connecting into a backplane, which receives a number of modules. The backplane has wiring and circuitry to provide power to the modules, to transmit digital data on parallel data buses and serial data lines, and to transmit discrete and analog signals between the modules.

The electrical connections to the modules are a major source of failure in such equipment because of connector pin and socket wear, corrosion, contamination, and mechanical damage. Furthermore, the nature of the electrical connector failures is such that they are often intermittent in nature and thereby difficult to locate and correct.

Attempts have been made in the past to reduce the number of electrical connections to modules. Light transmit and receive diodes have been used in modules to interface to purely optical backplane devices fabricated using either fiber-optic or other optical wave guides to divide light emitted by the transmit diodes on one module and deliver portions of the light energy to corresponding receive diodes on the other modules. Such optical backplane devices are difficult to fabricate in such a manner as to permit adequate and uniform distribution of optical energy to receiving modules. Because the optical power must be divided, such devices are highly vulnerable to losses in optical connectors.

Also, electro-optical backplanes have been devised in which the signals are transmitted between electronic modules and backplanes by conventional electric means and then converted to optical form in the backplane at each module location for optical transmission of data to conversion devices located in the backplane at each other module. Such electro-optical backplanes face the problems of providing uniform light division between modules and the normal problems associated with electrical connectors. Furthermore, if failures occur in such backplanes, replacement or repair of such backplanes normally involves major disassembly of the equipment because of the bottom of the module locations used for such backplanes.

SUMMARY OF THE INVENTION

In this invention, a cluster of modules is connected to a simplified backplane. The modules have normal electrical connections at the bottom for transmitting power to and from the backplane and for transmitting discrete, specialized digital, and analog signals to and from the backplane. For data transmission between modules, however, electro-optical devices are located at the top of each module. Each electro-optical device comprises a light pulse transmitter such as a light emitting diode (LED) and a light or photo detector, preferably a PIN diode. A transparent window is located above the diodes. LED driver circuits and PIN diode detector preamplifier circuits are provided for each LED and PIN diode pair to provide necessary interface between the LEDs and PIN diodes and their associated electrical data bus lines.

A data bus block fits across the tops of the modules. The data bus block contains conventional parallel data bus electrical conductors or lines. The data bus block also has an LED and PIN diode pair and their driver and pre-amplifier circuits for communicating with each LED and PIN diode pair in each of the modules. Electrical signals within the module are converted to light pulses and transmitted by the LED. A portion of the light pulse will reflect back to the PIN diode next to the transmitting LED and is used to test whether or not the signal was generated. The PIN diode in the data bus block receives the light pulse and converts it to electrical energy which is transmitted on the data bus lines. In turn, each LED in the data bus block connected to that bus line by its associated driver devices is caused to emit a corresponding light pulse for transmission to the associated optical receiver in each module connected by that data bus block.

For transmitting serial data from the cluster of modules to other modules, electro-optical connections are located on one or more of the modules in the cluster at the base or bottom. These electro-optical connections are similar to the connections at the top, except that they transmit into fiber optic lines located in the backplane. Also, preferably the serial electro-optical connections use two pairs of diodes at the base of the modules, one pair operating on one wavelength and the other pair operating on a different wavelength.

DESCRIPTION OF THE PREFERRED EMBODIMENT

Figure 1:
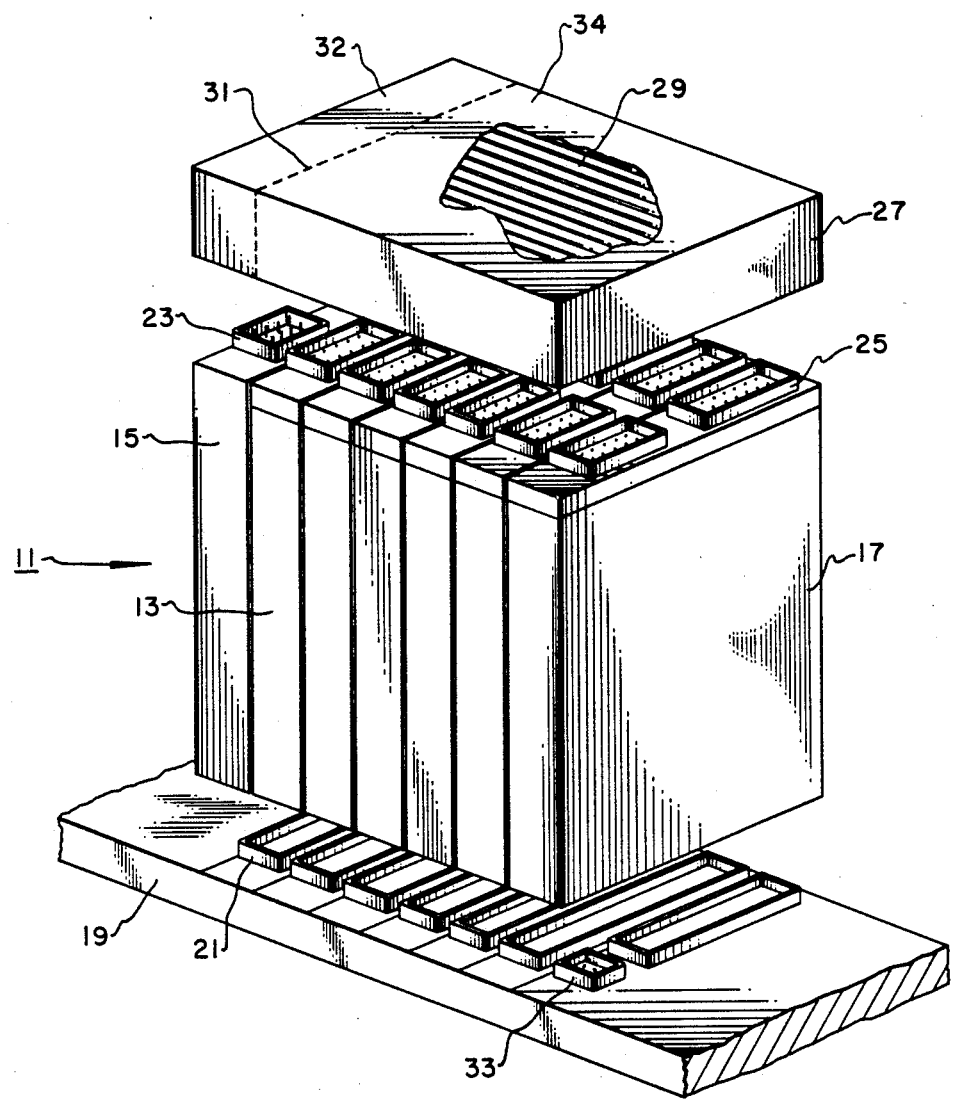
FIG. 1 is an exploded, perspective and simplified view of a cluster of electronic modules interconnected in accordance with this invention.

Referring to FIG. 1, a cluster 11 of electronic modules 13 is shown. Modules 13 are mounted parallel to each other and spaced-apart a short distance. Module 15, located on one end of the cluster 11, is a power supply module for supplying power to the electronic modules 13. On the other end of the cluster 11, a module 17 containing a serial data terminal operates similar to the other electronic modules 13, but is also used to transmit data to and from cluster 11 and other module clusters or other sources or destinations of serial data.

All of the modules, 13, 15 and 17 are mounted to a single backplane 19. Backplane 19 has power, ground, analog and discrete signal connections 21 for each of the modules 13, 15 and 17. These power, ground, analog and discrete signal connections 21 are of a conventional mechanical pin and socket type and are not shown in detail. Electrical conductors are located in the backplane 19 for transmitting power from power supply module 15 through the power and ground connections 21 to the other modules 13 and 17. Power supply module 15 also has a power and ground connection 23 at its top which is of a conventional mechanical pin and socket type.

Each module 13 and 17 has a light emitting and receiving means 25 at its top side that serves as an electro-optical connection to transmit data to and from each module 13 and 17. The data are transmitted to a data bus block 27, which is adapted to mount across the tops of the modules 13, 15 and 17 and is easily detached for replacement. Data bus block 27 contains all of the parallel data bus lines 29 for transmitting data between the modules 13 and 17. The data bus lines 29 are conventional electrical conductor lines tht would normally be located in the backplane 19. The digital data contained on these lines are transmitted to each of the modules 13 and 17, which uses these data according to its circuitry and its programming. The parallel data bus lines 29 are located only in the portion of the data bus block to the right of dotted line 31. The portion 32 of the data bus block above the power supply module 15 (to the left of dotted line 31) contains a mating electrical conductor (not shown) and electrical circuits for connecting electrical power to the data bus block from the electrical connector 23 on the power supply module 15. A complete magnetic shield 34 covers the entire data bus block 27 except for openings for the electro-optical and electrical connectors in bottom of the data bus block.

Electronic module 17 has a light emitting and receiving means (shown in FIGS. 6–8) on its bottom for connecting to a serial data fiber optic connection 33. The serial data fiber optic connection 33 transmits data to and receives data from modules in cluster 11, thus providing a serial data link between the modules in cluster 11 and other similar clusters or other equipment.

Figure 2:
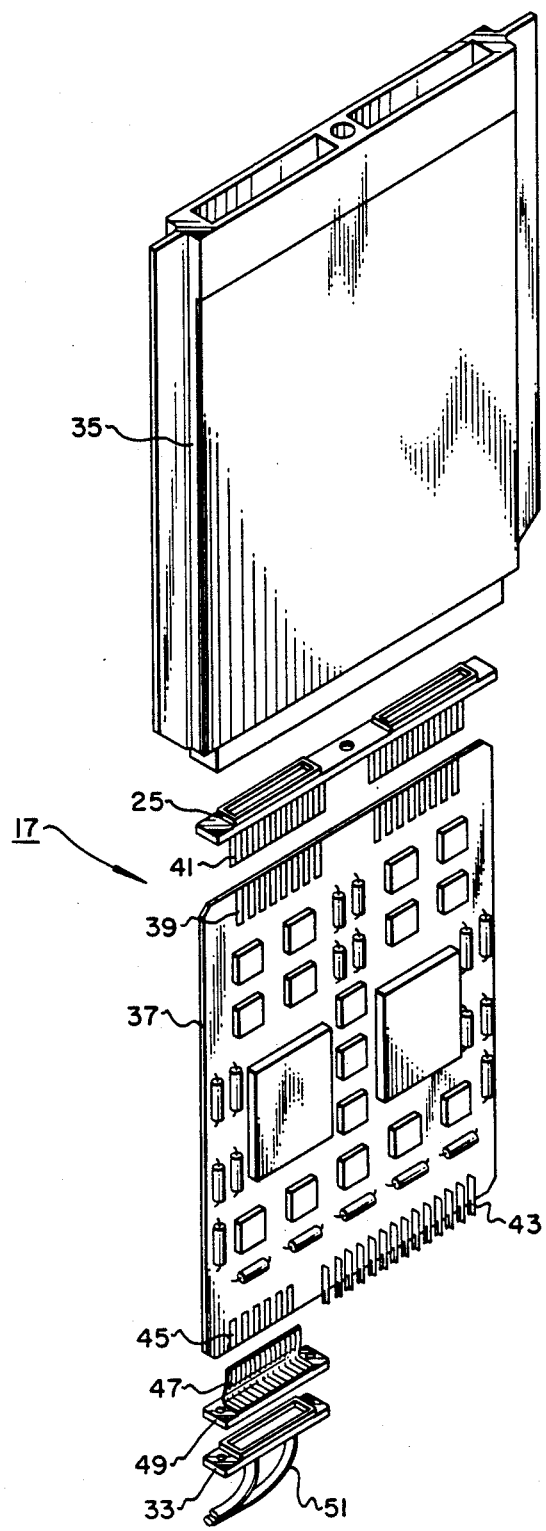
FIG. 2 is a perspective, exploded and more detailed view of one of the modules of FIG. 1.

Referring to FIG. 2, module 17 is shown in an exploded form. Modules 13 will appear the same as modules 17, except that they will not have means for connecting to the serial fiber optic connection 33 (FIG. 1). Module 17 is enclosed within a metal case 35. Module 17 includes an electronic circuit board or card 37 of conventional nature. A number of electrical data connections 39 are located at the top of the circuit board 37. The data connections 39 are affixed to electrical leads 41 which provide communication and power for the light emitting and receiving means 25. Conventional power and ground connections 43 are located at the bottom of circuit board 37. Connections 43 are adapted to fit within the backplane connections 21 shown in FIG. 1.

Circuit board 37 also has a number of electrical connections 45. Connections 45 are affixed to electrical leads 47, which provide power and electrical communication for a serial light emitting and receiving means 49.

The serial light emitting and receiving means 49 communicates pulses of lights to and receives pulses of light from the serial fiber optic connection 33, shown also in FIG. 1. The serial fiber optic connection 33 does not connect to any electrical wires in the backplane 19 (FIG. 1), rather connects to two fiber optic lines 51.

Figure 5:
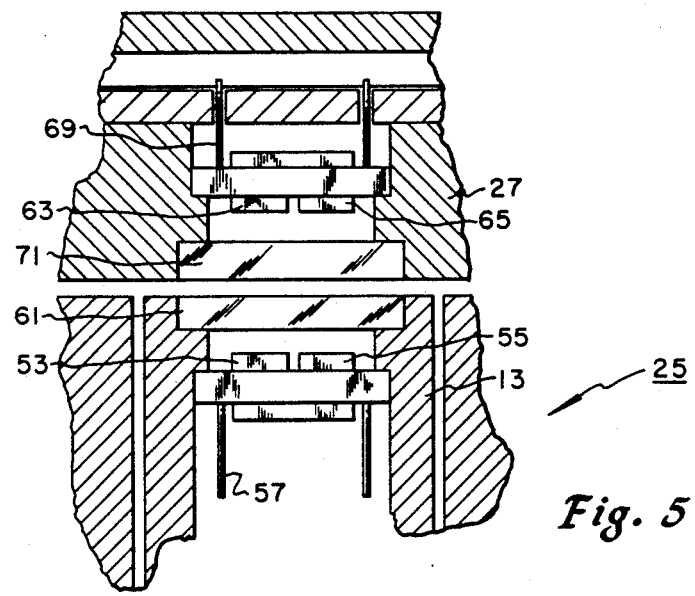
FIG. 5 is a simplified view of the electro-optical connections of one of the modules and of the data bus block as shown in FIG. 1.

The means by which the module light emitting and receiving means 25 communicates with the data bus block 27 in FIG. 1 is illustrated schematically in FIG. 5. A number of light receiving and transmitting pairs are mounted at the tops of each module 13 and 17 for transmitting light pulses to the data bus block 27 and also for receiving light pulses from the data bus block and converting them into electrical signals for use in the module. Each pair includes a light transmitting source, preferably an LED (light emitting diode) 53 that emits light in response to electrical signals received from the module 13 or 17. The term "LED" is used herein to include in addition to conventional light emitting diodes other light pulse transmitters such as ILD's (injection laser diodes). The light or photo detector is preferably a PIN (Positive Intrinsic Negative) diode 55 mounted next to the LED 53 for receiving light and converting the light pulses into electrical energy for use in the module 13 or 17. LED 53 and PIN diode 55 are conventional. Each is connected to leads 57, 59 extending from the module 13. A lens or window 61, preferably flat, is located above diodes 53 and 55 a short distance, providing a gap.

The data bus block 27 has a similar arrangement of a diode pair for each diode pair in each module 13 and 17. Each diode pair includes an LED 65 and a PIN diode 63, identical to LED 53 and PIN diode 55. LED 65 in the preferred embodiment is vertically aligned with PIN diode 55 and PIN diode 63 is vertically aligned with LED 53. Each is connected to leads 69 for supplying power for transmitting electrical signals to the parallel data bus lines 29 (FIG. 1). Support circuits such as LED drivers, pre-amps and logic between the diodes and electrical data bus lines may be located either directly adjacent to the diodes or in separate packages with the parallel data bus lines 29. A partially reflective flat lens or partially reflective window 71 is located a short distance from the diode pairs 63 and 65, providing a free space to prevent contact of the window and the diodes and to allow light from the LED 65 reflected from window 71 to reach PIN diode 63 for self-test purposes. Windows 61 and 71 are spaced apart a short distance, providing a gap, to avoid rubbing contact.

Figure 4:
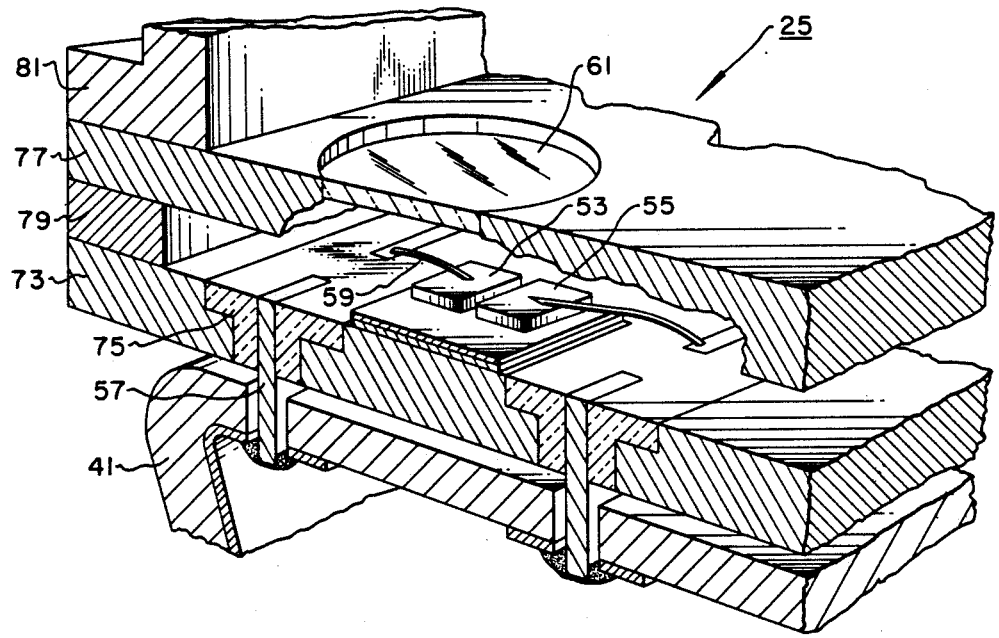
FIG. 4 is a partial, enlarged view of a portion of the electro-optical connectors shown in FIG. 3.

Referring to FIG. 4, a portion of each light emitting and receiving means 25 is shown in more detail. A metal base 73 contains glass insulators 75, which support the electrical leads 59. Base 73 is constructed with U.S. Pat. No. 3,444,619, Lomerson, May 20, 1969, as a reference. A cover plate 77 contains the windows 61, which preferably are circular and cover only a single diode pair 53, 55. A spacer 79 provides the necessary space. A gasket flange 81 is located above the plate 77 for connection with the data bus block 27 (FIG. 1).

Figure 3:
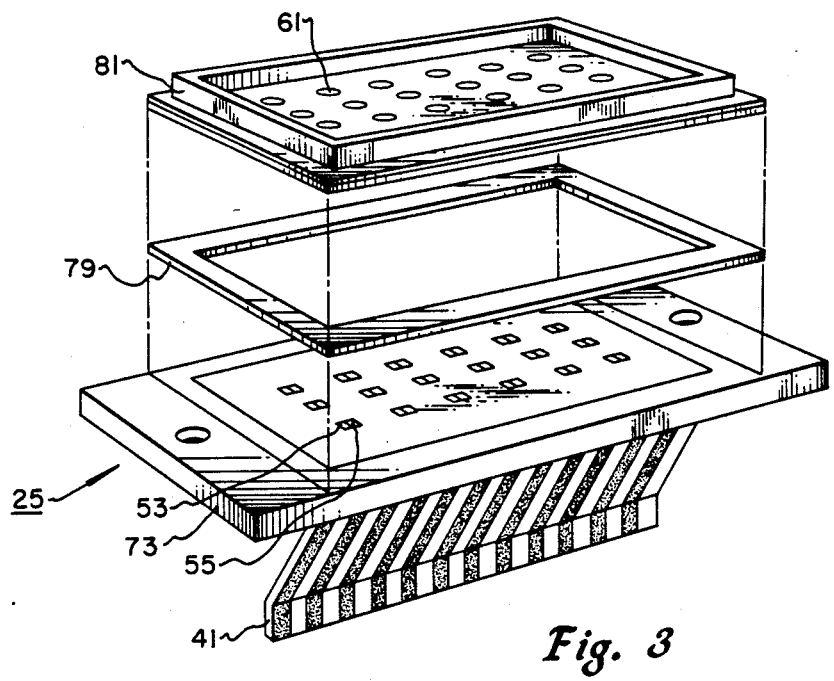
FIG. 3 is an exploded and simplified view of one of the electro-optical connections located at the tops of the modules of FIG. 1.

FIG. 3 is an enlarged view of one of the light emitting and receiving means 25, showing that there will be eighteen windows 61, three deep and six across in the preferred embodiment. There are preferably eighteen diode pairs 53, 55 in each light emitting and receiving means 25. The spacer 79 and gasket flange 81 are preferably rectangular. Although not shown in the same detail, the data bus block 27 will have an identical light emitting and receiving means facing downwardly, as indicated schematically in FIG. 5. Each module 13 has two light emitting and receiving means 25.

Figure 6:
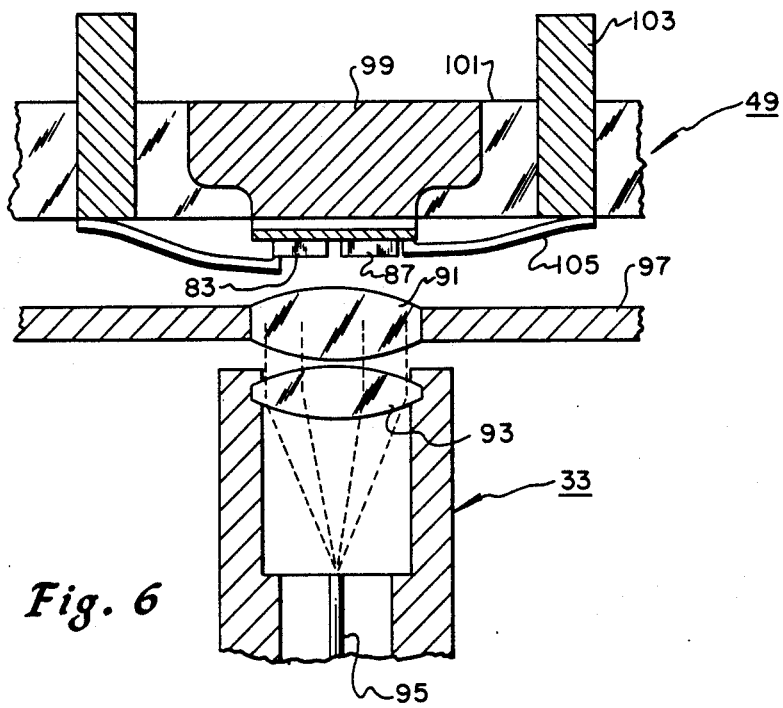
FIG. 6 is an enlarged simplified view of one of the serial electro-optical connections used at the bottom of the one of the modules of FIG. 1.
Figure 7:
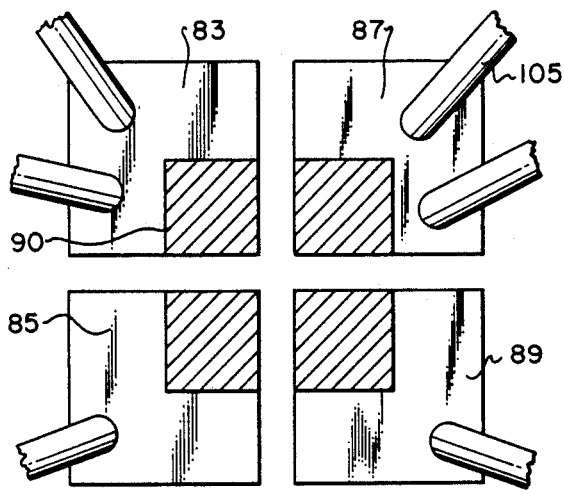
FIG. 7 is a simplified view of the diode pairs used in the electro-optical connection of FIG. 6.
Figure 8:
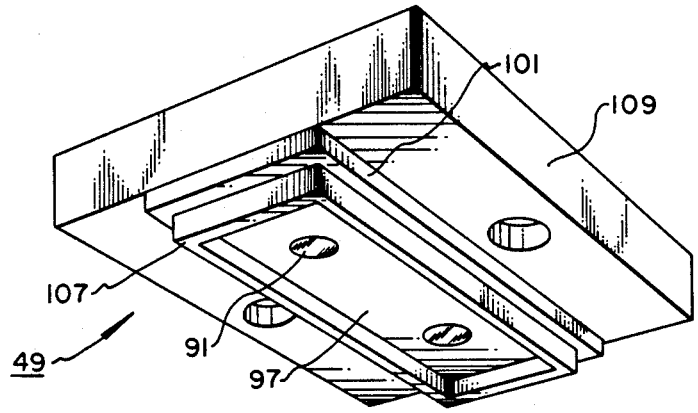
FIG. 8 is a perspective view of the top half of the electro-optical connection of FIG. 6.

The serial electro-optical means 49 and fiber optic connection 33 (FIG. 2) are shown in more detail in FIGS. 6-8. FIG. 7 is a schematic view looking upward into the serial light emitting and receiving means 49 of FIG. 2. In this serial electro-optical connection, two diode pairs are used, rather than single diode pairs as in the light emitting and receiving means 25 at the top (FIG. 2). There is an LED 83 and a PIN diode 85 next to each other, forming one pair. There is an LED 87 and a PIN doide 89 also located next to the diodes 83 and 85. The LED's 83 and 87 and PIN diodes 85 and 89 are similar to the LED's 53 and PIN diodes 55 at the top, as shown in FIG. 5. They differ in that the diode pairs 83 and 85 are constructed to operate on a different wavelength range than the diode pairs 87 and 89. The LED's 83 and 87 are constructed to emit light at narrow wavelength ranges separated from each other as much as possible, for example at approximately 820 nanometers and at 900 nanometers, respectively. The PIN diodes 85 and 89 normally have wide wavelength ranges, thus will need either separate filters or filter coatings to narrow the ranges at which they will convert light pulses to electrical signals. For example, PIN diode 85 may be coated to operate 800-840 nanometers and PIN diode 89 at 880-920 nanometers. PIN diode 85 will thus provide an electrical response only on receipt of light from LED 83. PIN diode 89 will thus provide and electrical response only upon receipt of light from LED 87 or from an LED operating at the same wavelength at the other end of fiber optic line 95. The cross-hatched area 90 in each diode 83, 85, 87 and 89 represents the active portion which emits and senses light.

Referring to FIG. 6, the diodes 83, 85, 87 and 89 all face downwardly toward a single, circular lens 91. Lens 91 has two convex sides and is spaced from the diodes 83, 85, 87 and 89 a short distance, providing a clearance between the lens and the diodes, and providing space to permit light from the transmitting LED's 83 and 87 reflected from the partially reflective window 91 to reach the receiving diodes 85 and 89.

The serial fiber optic connection 33, which is secured to backplane 19 (FIG. 1), has a lens 93 with two convex sides in vertical alignment with but spaced apart from lens 91. Lens 93 focuses the downwardly directed light to a fiber optic line 95, as shown by the dotted lines, to transmit the light pulses to another module. Also, light pulses transmitted through fiber optic line 95 pass through lenses 93, 91 and are directed onto the PIN diodes 85 and 89 (FIG. 7). Lens 91 is supported in a plate 97, shown also in FIG. 8. The diode pairs 83, 85, 87 and 89 are supported by a metal base 99 located within a glass insulator 101. Leads 103 and 105 supply power to the diode pairs 83, 85, 87 and 89 and transmit electrical signals from these diode pairs to the circuit board terminals 45. As shown in FIG. 8, a gasket flange 107 surrounds the plate 97. The rectangular gasket flange 107 is supported on a support 109 which is secured to the bottom of the case 35 (FIG. 2).

Figure 9:
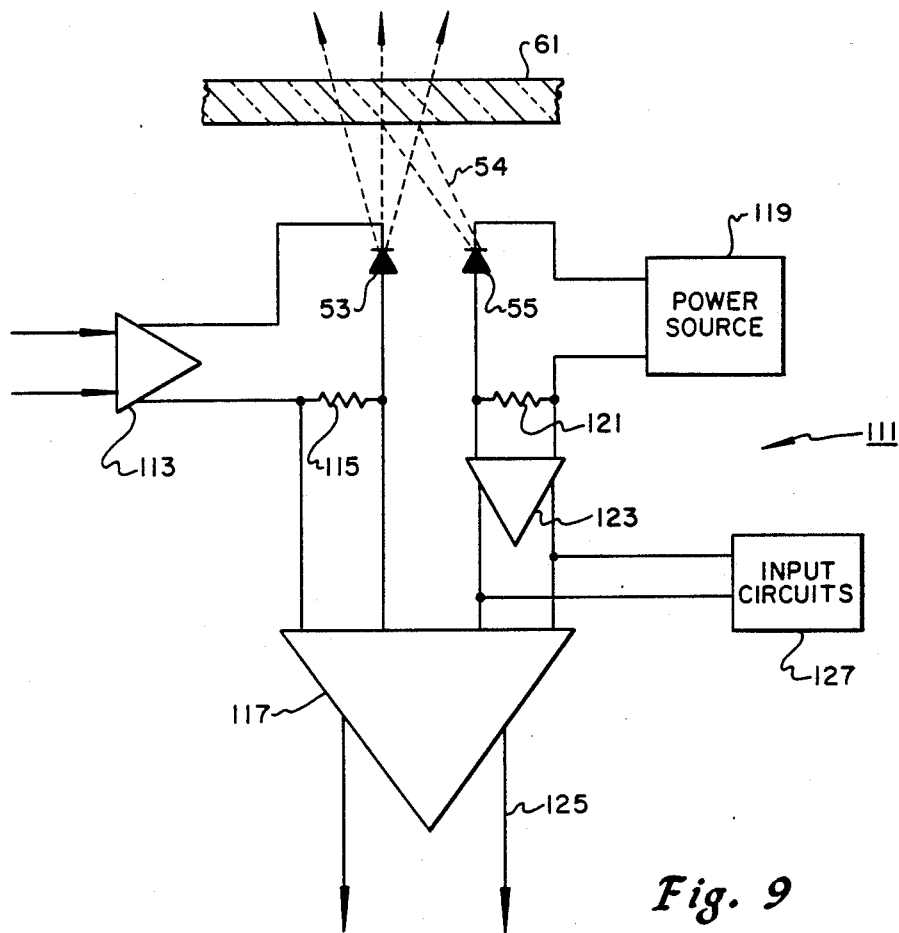
FIG. 9 is a functional electrical diagram of the self-test circuitry connected to the electro-optical diodes and their associated support circuits.

A self-test circuit 111 of a type that may be used with the diode pairs of the light emitting and receiving means in modules 13, 17 and data bus block 27, and also of the serial data light emitting and receiving means 49 is shown in FIG. 9. The self-test circuit 11 determines whether or not a pulse was properly emitted from LED's 53, 65, 83 and 87. As shown in FIG. 9, LED 53 is connected to a driver amplifier 113 and to a sense resistor 115. Leads of a comparator 117 are connected across sense resistor 115. Pin diode 55 is connected to a power source 119 and to a sense resistor 121. Two other leads of comparator 117 are connected to a preamplifier 123 and across sense resistor 121.

In operation, referring to FIG. 5, electronic signals contained within one or more of the modules 13 and 17 (FIG. 1) are applied to circuit means for driving the LED 53. The LED 53 emits light pulses which pass through the windows 61 and 71 and are received by the PIN diode 63. Referring to FIG. 9, a sufficient gap is provided between the diodes 53 and 55 and the window 61 so that a portion of the light 54 emitted by the LED 53 is reflected by the window 61 back to the PIN diode 55. Window 61 is partially reflective on the side facing the diodes to assure adequate reflection of light. Such reflected light pulses trigger the pin diode 55 to conduct an electrical current supplied by the PIN diode power source 119, causing an electrical voltage drop pulse to occur across the sense resistor 121 for each light pulse emitted by the LED 53. The resulting voltage pulses are amplified by the PIN diode preamplifier 123 and supplied to the input of a comparator circuit 117 as well as to the module signal input circuits 127. The LED driver 113 causes the LED 53 to emit light pulses by causing electrical current pulses to flow through the LED 53 and the LED sense resistor 115. The comparator circuit 117 compares each pulse from the PIN diode preamplifier 123 with electrical voltage pulses developed across the LED sense resistor 115 when the LED 53 is driven to emit light pulses. If a receive pulse from PIN diode preamplifier 123 is not detected by the comparator circuit to match a transmit pulse developed across LED sense resistor 115, the comparator circuit outputs a signal 125 to indicate that the transmission of the light pulses has not been detected. The components in FIG. 9 are conventional. Various types of comparator circuits of this nature may be constructed conventionally.

The light pulse received by the data bus block PIN diode 63 is converted into digital electrical pulses which are applied to one of the data bus lines 29. Lines 29 communicate the digital data to respective LED's 65 above all of the electronic modules 13 and 17 in the cluster 11. The LED's 65 above the adjacent modules 13 and 17 transmit light pulses in response to signals on data bus lines 29 down through windows 71 and 61 to be received by the PIN diodes 53. Similarly, a portion of the light pulse from LED 63 is reflected back by the window 71 to the PIN diode 65, which converts the light pulse into an electrical signal. A test circuit 111 (FIG. 9) in data bus block 27 receives the electrical signal and tests whether or not the light pulse from LED 65 was generated. The light pulse received by the PIN diodes 55 in the modules 13 and 17 is converted into electrical signals by conventional circuitry and applied to the electronic circuitry of the modules 13 and 17 for use according to the programming and the circuitry.

The LED's 53, 65 and PIN diodes 55 and 63 operate on the same wavelengths. LED's 53 and 65 will normally not be transmitting at the same time. However, there are preferably 36 diode pairs 53, 55 in the top of each module 13, 17, and these may transmit simultaneously with other diode pairs on the 36 parallel data bus lines (FIG. 1).

Electronic data that must be transmitted to electronic modules other than in cluster 11 are transmitted to the module 17. This data are transmitted to either LED 83 or LED 87 or both. LED 83 or 87 converts the electrical energy into light pulses which are transmitted through lenses 91 and 93 to the conventional fiber-optic line 95. A portion of the light emitted by LED 83 will be reflected back to PIN diode 85, which converts the light pulse to electrical energy to determine in self-test circuit 111 (FIG. 9) in module 17 whether or not the light pulse was generated. Similarly, a portion of the light pulse emitted by LED 87 is reflected back to PIN diode 89, which determines in test circuit 111 whether or not a light pulse was actually generated.

Since there are no screens between the diode pairs 83, 85, 87 and 89, the light reflected back from LED 83 is also reflected onto the PIN diode 89. Because the filtered PIN diode 89 has a different wavelength range, it will not provide a significant electrical response. In the same manner, a portion of the light pulse generated by LED 87 is reflected back to PIN diode 85. PIN diode 85 will not provide a significant electrical response because the wavelength of the light pulse from LED 87 is out of the range of the filtered PIN diode 85.

Electronic data can also be transmitted from a module external from cluster 11 into module 17. The data from the external module is converted into light pulses in the same manner and applied to fiber optic line 95. These light pulses pass through lenses 91 and 93 to be received by the PIN diodes 85 and 89. If the light pulses are in the proper wavelength range, PIN diode 85 will generate an electrical response for use in the electronic circuitry of module 17. If outside of the range of PIN diode 85, but inside the range of PIN diode 89, PIN diode 89 will generate an electrical response to be used in the electronic circuitry of module 17. Because of the different wavelengths, it is possible for one of the LED's 83 or 87 to be transmitting information on one wavelength, while light pulses from an external module are received by the other PIN diode 85 or 89 simultaneously, but of a different wavelength. Both LED's 83 and 87 may transmit simultaneously.

The invention offers numerous advantages. Except for electrical connections necessary for transmission of power to the modules and to the data bus block, no electrical connector pins are required for serial and parallel digital data transmissions to and from the electronic modules. The transmit and receive diodes being located on the modules and on the data bus block allow the inclusion of electrical circuits in the modules for each diode pair to enable positive self-testing of all interface equipment. It is possible to verify proper operation of the electro-optical interface for each pulse transmission. By generation of test pulses from the transmit diode of each diode pair, it is possible to test the entire transmit and receive functions of each module during test modes of operation. The use of such techniques permits positive testing of each module and isolation of failures between the modules and the data bus block.

Placing the data bus block in a completely shielded package located at the top, rather than at the bottom of the electronic modules, allows the optical windows to be easily examined and cleaned without major disassembly of the equipment. The electrical portions of the data bus block can be easily isolated from electro-magnetic interference from noise sources such as power and input/output lines normally located in conventional backplanes at the bottom of card racks. In the event of failure of one of the active elements in the data bus block, the entire data bus block can be easily replaced without disassembly of the equipment, as would normally be required to replace failed components located in a conventional backplane location.

Because individual modules' input/output lines are divided between the bottoms and tops of the modules, the overall width of the modules may be reduced, which can simply module cooling and simplify packaging. The data bus block can be easily standardized for use in a variety of applications and need not be affected by module power input and other input/output requirements that tend to vary both from module to module within a particular system design and between different system designs. The backplanes contain only power supply lines, analog and discrete signal lines, and the specialized input/output lines for serial transmission, and are reduced in complexity over normal backplanes that contain conventional electrical parallel data bus lines. Placing two diode pairs for the serial data transmission for a single optical port permits more than one channel of information to be placed in the sample optical port. If desired, the dual diode pairs as used in the serial connection, could also be used at the top of the modules for data bus interface to reduce the overall size of the data bus block.

While the invention has been shown in only one of its forms, it should be apparent to those skilled in the art that it is not so limited but is susceptible to various changes without departing from the scope of the invention.

I claim:

1. An apparatus for communicating parallel digital electronic data between a plurality of electronic modules carried parallel to each other in a cluster, each module having a set of digital electrical data bus lines, the apparatus comprising in combination:
   a parallel digital data bus block mounted across the cluster of modules;
   a plurality of parallel digital electrical data bus lines contained in the data bus block;
   a plurality of light emitting means, each mounted along a common side of each module for transmitting light pulses in response to corresponding electrical signals provided from the data bus lines within each module;
   a plurality of light receiving means mounted along one side of the data bus block, each aligned with one of the light emitting means in one of the modules, for receiving light pulses from the aligned light emitting means in each module in the cluster and for producing a corresponding electrical signal for each light pulse in one of the data bus lines of the data bus block;
   a plurality of light emitting means mounted along one side of the data bus block, each mounted adjacent to and paired with one of the light receiving means within the data bus block, for transmitting light pulses in response to corresponding electrical signals received from one of the data bus lines of the data bus block, which were provided by one of the light receiving means of the data bus block; and
   a plurality of light receiving means, each mounted along a common side of each of the modules and mounted adjacent to and paired with one of the light emitting means of the module, for receiving light pulses from an aligned light emitting means of the data bus block and for producing corresponding electrical signals in one of the data bus lines within the module.

2. The apparatus according to claim 1, further comprising:
   a partially reflective module window mounted to each of the modules, separating the light emitting means and the light receiving means of each of the modules from the aligned light emitting means and light receiving means of the data bus block, for reflecting a portion of each light pulse generated by the light emitting means of each module back to the adjacent light receiving means of each module;
   self-test circuit means connected to each pair of light emitting means and light receiving means in each module, for monitoring an electrical signal corresponding to each light pulse transmitted and comparing the electrical signal to an electrical signal corresponding to each reflected light pulse received by the adjacent light receiving means, and for providing an indication if the comparison indicates a reflected light pulse is not properly received;
   a partially reflective data bus block window mounted to the data bus block, separating each of the light emitting means and the light receiving means of the data bus block from the aligned light emitting means and light receiving means of adjacent module, for reflecting a portion of each light pulse generated by the light emitting means of the data bus block back to the adjacent light receiving means of the data bus block; and
   self-test circuit means connected to each pair of light emitting means and light receiving means in the data bus block, for monitoring an electrical signal corresponding to each light pulse transmitted and comparing the electrical signal to an electrical signal corresponding to each reflected light pulse received by the adjacent light receiving means in the data bus block, and for providing an indication if the comparison indicates a reflected light pulse is not properly received.

3. An apparatus for communicating parallel digital electronic data between a plurality of electronic modules carried parallel to each other in a cluster, each module having a set of digital electrical data bus lines, the apparatus comprising in combination:
   a parallel digital data bus block mounted across the cluster of modules;
   a plurality of parallel digital electrical data bus lines contained in the data bus block;
   a plurality of light emitting means, each mounted along a common side of each module for transmitting light pulses in response to corresponding electrical signals provided from the data bus lines within each module;
   a plurality of light receiving means mounted along one side of the data bus block, each aligned with one of the light emitting means in one of the modules, for receiving light pulses from the aligned light emitting means in each module in the cluster and for producing a corresponding electrical signal for each light pulse in one of the data bus lines of the data bus block;
   a plurality of light emitting means mounted along one side of the data bus block, each mounted adjacent to and paired with one of the light receiving means within the data bus block, for transmitting light pulses in response to corresponding electrical signals received from one of the data bus lines of the data bus block, which were provided by one of the light receiving means of the data bus block;
   a plurality of light receiving means, each mounted along a common side of each of the modules and mounted adjacent to and paired with one of the light emitting means of the module, for receiving light pulses from an aligned light emitting means of the data bus block and for producing corresponding electrical signals in one of the data bus lines within the module;
   at least one serial light emitting and receiving means mounted to a side of at least one module for transmitting and receiving serial data to and from a module located other than in the cluster, the serial light emitting and receiving means transmitting light pulses in response to electrical signals within each module and converting light pulses received into electrical signals for receipt in each module; and
   a fiber optic line carried in an optical connector coupled to the serial light emitting and receiving means and connected to a module located other than in the cluster;
   the fiber optic line receiving light pulses from and transmitting light pulses to the serial light emitting and receiving means.

4. The apparatus according to claim 3 wherein the serial light emitting and receiving means for each fiber optic line comprises:
   two light emitters mounted adjacent each other, each adapted to transmit light of a different wavelength range in response to an electrical signal, and two photo detectors mounted adjacent each other and adjacent the emitters and positioned so that each photo detector is in alignment with all of the light pulses coming from the fiber optic line, one of the photo detectors having a wavelength range that causes it to produce an electrical pulse only when it receives light in the wavelength range of one of the light emitters, and the other having a wavelength range that causes it to produce an electrical pulse only when it receives light in the wavelength range of the other of the light emitters.

5. An apparatus for communicating electronic data by a combination of light pulses and electrical signals between a plurality of electronic modules carried parallel to each other in a cluster, each module having a set of digital data bus lines, comprising in combination:
   a plurality of light emitters mounted along the top of each module for transmitting light pulses in response to electrical signals provided from the data bus lines within each module;
   a plurality of photo detectors, each mounted next to one of the light emitters along the top of each module for receiving light pulses and converting them to electrical signals for one of the data bus lines within each module;
   a partially reflective window mounted over each light emitter and photo detector of each module;
   a data bus block removably carried across the tops of the modules, and having a plurality of electrical parallel data bus lines therein;
   a plurality of light emitters and photo detectors mounted along the bottom of the data bus block, each light emitter and photo detector of the data bus block being in alignment with one of the light emitters and photo detectors of the modules, for receiving light pulses from the modules and converting them to electrical signals for transmission on the data bus lines, and for transmitting light pulses to the modules in response to electrical signals on the data bus lines of the data bus block provided by the photo detectors of the data bus block;

a partially reflective window mounted over each light emitter and photo detector of the data bus block and separated from the window of the module by a gap;

the windows reflecting back to each photo detector a portion of the light pulse generated by the adjacent light emitter; and self-test circuit means for monitoring an electrical signal corresponding to each light pulse transmitted and comparing the electrical signal to an electrical signal corresponding to each reflected light pulses received, and for providing an indication if the comparison indicates that a reflected light pulse is not received for each light pulse intended to be transmitted.

* * * * *